US012790518B2

(12) United States Patent
Motoike et al.

(10) Patent No.: US 12,790,518 B2
(45) Date of Patent: Nov. 10, 2026

(54) ADHESIVE SHEET FOR REAR SURFACE GRINDING, SEMICONDUCTOR WAFER MANUFACTURING METHOD, AND BASE MATERIAL SHEET

(71) Applicants: DISCO CORPORATION, Tokyo (JP); DENKA COMPANY LIMITED, Tokyo (JP)

(72) Inventors: Shingo Motoike, Tokyo (JP); Kazuki Iizuka, Tokyo (JP); Masashi Nakamura, Tokyo (JP); Mizuki Hasumi, Tokyo (JP)

(73) Assignees: DISCO CORPORATION, Tokyo (JP); DENKA COMPANY LIMITED, Tokyo (JP)

( * ) Notice: Subject to any disclaimer, the term of this patent is extended or adjusted under 35 U.S.C. 154(b) by 290 days.

(21) Appl. No.: 18/559,745

(22) PCT Filed: May 11, 2022

(86) PCT No.: PCT/JP2022/019981
§ 371 (c)(1),
(2) Date: Nov. 8, 2023

(87) PCT Pub. No.: WO2022/249888
PCT Pub. Date: Dec. 1, 2022

(65) Prior Publication Data

US 2024/0254368 A1 Aug. 1, 2024

(30) Foreign Application Priority Data

May 26, 2021 (JP) ................................ 2021-088684

(51) Int. Cl.
*C09J 7/29* (2018.01)
*C09J 7/38* (2018.01)
(Continued)

(52) U.S. Cl.
CPC ................ *C09J 7/29* (2018.01); *C09J 7/385* (2018.01); *C09J 135/02* (2013.01); *H10P 52/00* (2026.01);
(Continued)

(58) Field of Classification Search
None
See application file for complete search history.

(56) References Cited

U.S. PATENT DOCUMENTS

2011/0229703 A1 9/2011 Hayata et al.
2016/0181140 A1 6/2016 Moriyama et al.
(Continued)

FOREIGN PATENT DOCUMENTS

CN 108140567 A 6/2018
CN 110272696 A 9/2019
(Continued)

OTHER PUBLICATIONS

Machine Translation of JP 2013-211439 (Year: 2013).*
(Continued)

*Primary Examiner* — Anthony Ho
(74) *Attorney, Agent, or Firm* — CHRISTENSEN O'CONNOR JOHNSON KINDNESS PLLC

(57) ABSTRACT

The present invention aims to provide an adhesive sheet for back grinding capable of suppressing peeling of an adhesive layer and capable of peeling a wafer easily from an adhesive sheet.

According to the present invention, provided is an adhesive sheet for back grinding of a semiconductor wafer having a convex part, comprising: a base material layer; and an adhesive layer provided on the base material layer, wherein: the adhesive layer comprises an opening part having a diameter smaller than a diameter of the semiconductor wafer; the adhesive layer is adhered to an outer peripheral
(Continued)

part of the semiconductor wafer so shat the convex part of the semiconductor wafer is placed in the opening part; the adhesive layer is configured so that the convex part is protected by the base material layer with the semiconductor wafer adhered to the adhesive layer; the base material layer comprises a cushion layer and a surface treatment layer provided thereon; the adhesive layer is provided on the surface treatment layer; the surface treatment layer is formed of an acrylic resin composition containing an acrylic resin; the acrylic resin is cross-linked by light irradiation or heating; and the adhesive layer is formed of an acrylic resin composition containing an acrylic resin.

6 Claims, 10 Drawing Sheets

(51) Int. Cl.
*C09J 135/02* (2006.01)
*H10P 52/00* (2026.01)
*H10P 72/70* (2026.01)

(52) U.S. Cl.
CPC ..... *H10P 72/7402* (2026.01); *C09J 2203/326* (2013.01); *C09J 2301/162* (2020.08); *C09J 2301/204* (2020.08); *C09J 2301/302* (2020.08); *C09J 2433/00* (2013.01); *C09J 2433/006* (2013.01)

(56) References Cited

U.S. PATENT DOCUMENTS

| | | | |
|---|---|---|---|
| 2018/0247870 | A1 | 8/2018 | Priewasser |
| 2019/0055396 | A1 | 2/2019 | Sato et al. |
| 2019/0252254 | A1 | 8/2019 | Priewasser et al. |
| 2019/0330465 | A1 | 10/2019 | Sato et al. |
| 2020/0043754 | A1 | 2/2020 | Namioka |
| 2022/0148905 | A1 | 5/2022 | Priewasser et al. |

FOREIGN PATENT DOCUMENTS

| | | | |
|---|---|---|---|
| JP | 2010174067 | | 8/2010 |
| JP | 2012216619 | | 11/2012 |
| JP | 2013211439 | | 10/2013 |
| JP | 2015005598 | A | 1/2015 |
| JP | 2018526826 | | 9/2018 |
| JP | 2019-140387 | | 8/2019 |
| JP | 2020024976 | | 2/2020 |
| KR | 20140118378 | A | 10/2014 |
| WO | WO2020/175364 | A1 | 9/2020 |

OTHER PUBLICATIONS

Tomoyuki Aogaki et al., "New Evaluation Methods for Pressure Sensitive Adhesive (PSA) Tapes Used in the Semiconductor Industry," Furukawa Review, No. 25 (2004).

* cited by examiner

ADHESIVE SHEET FOR REAR SURFACE GRINDING, SEMICONDUCTOR WAFER MANUFACTURING METHOD, AND BASE MATERIAL SHEET

CROSS-REFERENCE TO RELATED APPLICATIONS

The present application is a national stage of PCT/JP2022/019981, filed May 11, 2022, which claims the benefit of JP 2021-088684, filed May 26, 2021, the disclosures of which are incorporated by reference in their entirety.

TECHNICAL FIELD

The present invention relates to an adhesive sheet for back grinding, a method for manufacturing a semiconductor wafer using the same, and a base material sheet.

BACKGROUND ART

When a semiconductor wafer is processed, an adhesive sheet is adhered to the wafer to protect it from damage. For example, in the back grinding step for the semiconductor wafer, the adhesive sheet is adhered to the semiconductor wafer to protect the pattern surface thereof. The adhesive sheet is required to have followability to follow unevenness of the pattern surface (bump followability) in terms of adhesiveness to the uneven pattern surface such as a protruding electrode (bump) and reliability of pattern surface protection.

As an adhesive sheet having the followability, adhesive sheets with a thicker adhesive or a flexible resin layer with cushioning properties between a base material film and an adhesive are common in the market. However, when the unevenness of the pattern surface is significant, risks of insufficient followability and adhesive residue increase.

In Patent Literature 1, an adhesive sheet is configured to have an adhesive layer with an opening part having a diameter smaller than an outer diameter of a semiconductor wafer on one side of a base material layer, the adhesive layer is adhered to the outer peripheral part of the semiconductor wafer so that the convex part of the semiconductor wafer is placed in the opening part of the adhesive layer by vacuum mounting, and the convex part is embedded in the base material layer, which prevents adhesive residue and deterioration of the protective function.

CITATION LIST

Patent Literature

[Patent Literature 1] JP-A-2019-140387

SUMMARY OF INVENTION

Technical Problem

The inventors of the present invention conducted an intensive study on the adhesive sheet disclosed in Patent Literature 1 and found that the adhesive layer may peel from the base material layer. The inventors of the present invention also conducted an intensive study to solve this problem and found that the adhesion between the adhesive layer and the base material layer was improved by applying corona discharge treatment to the base material layer and the peeling problem of the adhesive layer was solved.

Incidentally, although applying corona discharge treatment only to the area of the base material layer where the adhesive layer is to be formed is possible by using a mask, productivity is significantly reduced. For this reason, corona discharge treatment was applied to the entire surface of the base material layer. When the wafer was adhered to the adhesive sheet manufactured in this way, it was found that the wafer was strongly adhered to the base material layer as well, causing a new problem of difficulty in peeling the wafer from the adhesive sheet.

The present invention was made in consideration of these circumstances, and aims to provide an adhesive sheet for back grinding capable of suppressing peeling of an adhesive layer and capable of peeling a wafer easily from an adhesive sheet.

Solution to Problem

According to the present invention, provided are:

(1) an adhesive sheet for back grinding of a semiconductor wafer having a convex part, comprising: a base material layer; and an adhesive layer provided on the base material layer, wherein: the adhesive layer comprises an opening part having a diameter smaller than a diameter of the semiconductor wafer; the adhesive layer is adhered to an outer peripheral part of the semiconductor wafer so shat the convex part of the semiconductor wafer is placed in the opening part; the adhesive layer is configured so that the convex part is protected by the base material layer with the semiconductor wafer adhered to the adhesive layer; the base material layer comprises a cushion layer and a surface treatment layer provided thereon; the adhesive layer is provided on the surface treatment layer; the surface treatment layer is formed of an acrylic resin composition containing an acrylic resin; the acrylic resin is cross-linked by light irradiation or heating; and the adhesive layer is formed of an acrylic resin composition containing an acrylic resin, (2) the adhesive sheet of (1), wherein a storage modulus of the surface treatment layer at 180° ° C. is $1.0\times10^4$ Pa to $1.0\times10^8$ Pa, (3) the adhesive sheet of (1) or (2), wherein the convex part is protected by being embedded in the base material layer, (4) the adhesive sheet of any one of (1) to (3), wherein the semiconductor wafer is adhered to adhesive layer under reduced pressure, (5) the adhesive sheet of any one of (1) to (4), wherein an adhesive force measured in accordance with JIS Z0237 at 23° C. between the base material layer and the semiconductor wafer after heating the semiconductor wafer to which the base material layer of a test piece cut from the adhesive sheet is adhered for 1 minute at 100° C. and cooling to room temperature is lower than 6 N/200 mm, (6) a method for manufacturing a semiconductor wafer using the adhesive sheet of any one of (1) to (5), comprising: a frame adhering step; a wafer adhering step; a heating step; a cutting step; a resin curing step; and a grinding step, wherein: in the frame adhering step, the adhesive sheet is adhered to a ring frame; in the wafer adhering step, the adhesive sheet is adhered to the outer peripheral part of the semiconductor wafer under reduced pressure, the outer peripheral part on a surface of the semiconductor wafer where the convex part is provided; in the heating step, the base material layer is heated; in the cutting step, the adhesive sheet is cut along an outer periphery of the semiconductor wafer; in the resin curing step, the base material layer is brought in contact with a curable resin after the wafer adhering step, and the curable resin is cured in that state; and in the grinding step, a backside of the semiconductor wafer is ground, (7) a base material sheet, comprising: a cushion layer; and a surface treatment layer provided thereon, wherein: the surface treatment layer is formed of an acrylic resin composition containing an acrylic resin; and the acrylic resin is cross-linked by light irradiation or heating, and (8) the base material sheet of (7), wherein a storage modulus of the surface treatment layer at 180° C. is $1.0\times10^4$ Pa to $1.0\times10^8$ Pa.

The inventors of the present invention conducted an intensive study and found that the above-mentioned problems were found by adopting a surface treatment layer and an adhesive layer with a specific configuration, leading to the completion of the present invention.

DESCRIPTION OF EMBODIMENTS

Figure 1:
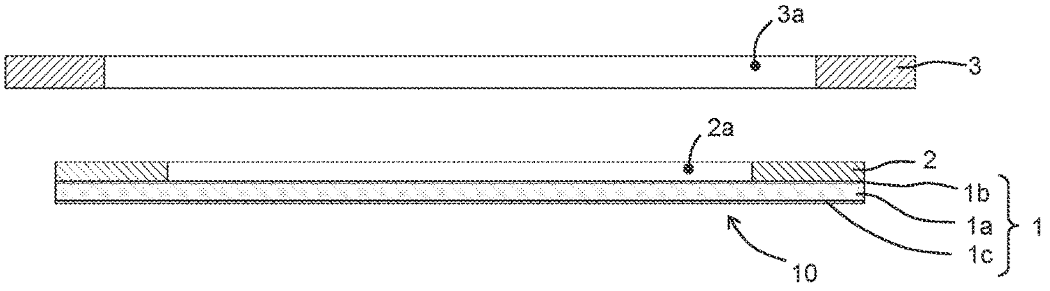
FIG. 1 is a cross-sectional view showing a state before adhering a ring frame 3 to an adhesive sheet 10 of one embodiment of the present invention.

Hereinafter, embodiments of the present invention will be described. Various features shown in the following embodiments can be combined with each other. In addition, the invention can be made independently for each feature.

1. Adhesive Sheet

An adhesive sheet 10 of one embodiment of the present invention will be described using FIGS. 1 to 9. The adhesive sheet 10 of the present embodiment has a base material layer 1 and an adhesive layer 2 provided on the base material layer 1. The adhesive sheet 10 is used to grind a backside 4*b* of a semiconductor wafer 4 having a convex part 5. Hereinafter, each configuration will be described.

1-1. Base Material Layer 1

As shown in FIG. 1, the base material layer 1 has a cushion layer 1*a*, a surface treatment layer 1*b*, and a barrier layer 1*c*. The surface treatment layer 1*b* is provided on the cushion layer 1*a*. The barrier layer 1*c* is preferably provided on the opposite side of the surface treatment layer 1*b* (or the adhesive layer 2) as viewed from the cushion layer 1*a*. The barrier layer 1*c* is preferably adhered to the cushion layer 1*a* via an unshown adhesive layer. The barrier layer 1*c* can be omitted.

The entire thickness of the base material layer 1 is preferably 50 to 400 μm, more preferably 100 to 350 μm, and even more preferably 200 to 300 μm. The thickness is, specifically for example, 50, 100, 150, 200, 250, 300, 350, or 400 μm, and may be in the range between the two values exemplified herein.

<Cushion Layer 1*a*>

Figure 2:
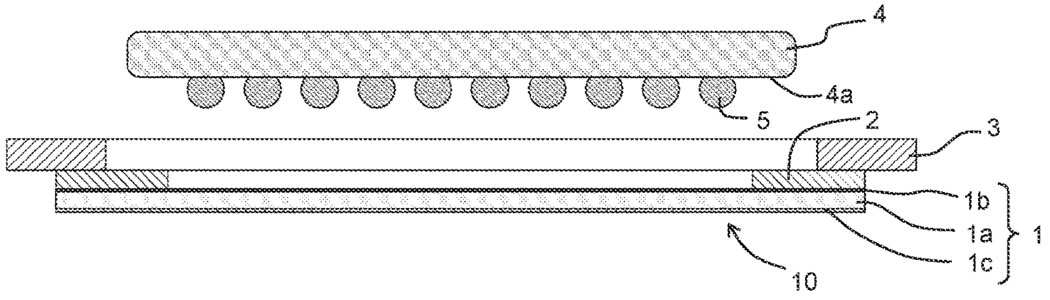
FIG. 2 is a cross-sectional view showing a state after adhering the ring frame 3 to the adhesive sheet 10 from the state in FIG. 1.

The cushion layer 1*a* is a layer for protecting the convex part 5 of the semiconductor wafer 4 shown in FIG. 2. The cushion layer 1*a* is preferably configured of a thermoplastic resin. The composition of the thermoplastic resin is not particularly limited. Examples of the thermoplastic resin that can be used include ionomer resins in which the carboxyl groups of a simple substance and/or composite such as ethylene-methacrylic acid-acrylic ester ternary copolymers, ethylene-methacrylic acid copolymers, and ethylene-acrylic acid copolymers are cross-linked by metal ions such as sodium ions, lithium ions, and magnesium ions; soft polypropylene resins blended with styrene-butadiene copolymer rubber, styrene-butadiene-styrene block copolymer rubber, styrene-isoprene-styrene block copolymer rubber, ethylene-propylene rubber, or the like; low density polyethylene; ethylene-propylene block copolymer; ethylene-propylene random copolymer; ethylene-vinyl acetate copolymer; ethylene-methacrylic acid copolymer; ethylene-1 octene copolymer; and polybutene. Among these, ionomer resins are preferred.

The ratio Ra (mass %) of the (meth)acrylic monomer unit in the resin configuring the cushion layer 1*a* is preferably lower than the ratio Rb (mass %) of the (meth)acrylic monomer unit in the acrylic resin configuring the surface treatment layer 1*b*. In this case, the technical significance of providing the surface treatment layer 1*b* is prominent because the adhesion between the adhesive layer 2 and the surface treatment layer 1*b* that are configured with the acrylic resin compositions is higher than that between the adhesive layer 2 and the cushion layer 1*a*. The value of (Rb−Ra) is, for example, 10 to 100 mass %, and preferably 30 to 100 mass %. This value is, specifically for example, 10, 20, 30, 40, 50, 60, 70, 80, 90, or 100 mass %, and may be in the range between the two values exemplified herein.

The storage modulus E'a of the cushion layer 1*a* at 180° C. is preferably lower than the storage modulus E'b of the surface treatment layer 1*b* at 180° C. When the storage modulus E'a of the cushion layer 1*a* is low under a high temperature condition, the cushion layer 1*a* is likely to be excessively softened during heating and strongly adhered to the wafer, resulting in difficulty in peeling. Occurrence of such a problem is suppressed by providing the surface treatment layer 1*b*. Therefore, the technical significance of providing the surface treatment layer 1*b* is prominent when the storage modulus E'a is lower than the storage modulus E'b. When the storage modulus E'a cannot be measured due to melting of the cushion layer 1*a*, the storage modulus E'a is taken as 0 for convenience.

The weight average molecular weight (Mw) of the above-described thermoplastic resin is preferably 10000 to 1000000, and more preferably 50000 to 500000. The weight average molecular weight (Mw) is a value in terms of polystyrene measured by gel permeation chromatography (GPC).

The softening temperature (JIS K7206) of the above-described thermoplastic resin is preferably 45 to 200° C., and more preferably 55 to 150° C. The softening temperature is, specifically for example, 45, 50, 55, 60, 65, 70, 75, 80, 90, 100, 110, 120, 130, 140, 150, 160, 170, 180, 190, or 200° C., and may be in the range between the two values exemplified herein.

The melting point (JIS K7121) of the above-described thermoplastic resin is preferably 60 to 200° ° C., and more preferably 80 to 150° ° C. The melting point is, specifically for example, 60, 70, 80, 90, 100, 110, 120, 130, 140, 150, 160, 170, 180, 190, or 200° C., and may be in the range between the two values exemplified herein.

The melt flow rate (MFR) (JIS K7210, 125° C./10.0 kg load) of the above-described thermoplastic resin is 0.2 to 30 g/10 min, and more preferably 0.3 to 20 g/10 min.

When the thermoplastic resin has the properties as described above, the cushion layer 1*a* is moderately softened as the base material layer 1 is heated, making it easy to embed the convex part 5 in the base material layer 1.

The thickness of the cushion layer 1*a* is preferably 50 to 400 μm, more preferably 100 to 350 μm, and even more preferably 200 to 300 μm. The thickness is, specifically for example, 50, 100, 150, 200, 250, 300, 350, or 400 μm, and may be in the range between the two values exemplified herein.

<Surface Treatment Layer 1*b*>

The surface treatment layer 1*b* is formed of an acrylic resin composition containing an acrylic resin, and cross-linked by light irradiation or heating. When the adhesive layer 2 is formed directly on the cushion layer 1*a*, peeling of the adhesive layer 2 may occur if the adhesion between the cushion layer 1*a* and the adhesive layer 2 is not good. However, the peeling of the adhesive layer 2 can be suppressed by forming the surface treatment layer 1*b* on the cushion layer 1*a* and by forming the adhesive layer 2 with an acrylic resin composition.

When corona discharge treatment is applied to the cushion layer 1*a* to improve the adhesion between the cushion layer 1*a* and the adhesive layer 2, and this cushion layer 1*a* is adhered to a semiconductor wafer, the adhesive force between the cushion layer 1*a* and the semiconductor wafer may become too high, making it difficult to peel the semiconductor wafer from the cushion layer 1*a*. In the present embodiment, the surface treatment layer 1*b* is formed on the cushion layer 1*a*, and the surface treatment layer 1*b* is adhered to a semiconductor wafer. As described above, since the surface treatment layer 1*b* has excellent adhesion to the adhesive layer 2 without corona discharge treatment, corona discharge treatment is not required for the surface treatment layer 1*b*. For this reason, the adhesive force between the base material layer 1 and the semiconductor wafer can be reduced by providing the surface treatment layer 1*b*.

Specifically, the adhesive force measured in accordance with JIS Z0237 at 23° C. between the base material layer 1 and the semiconductor wafer after heating the semiconductor wafer to which the base material layer 1 of the test piece cut from the adhesive sheet 10 is adhered for 1 minute at 100° C. and cooling to room temperature can be lower than 6 N/200 mm by providing the surface treatment layer 1*b*. In this case, since the adhesive force between the base material layer 1 and the semiconductor wafer is lower than that between the adhesive layer 2 and the semiconductor wafer, it is preferred. This adhesive force is, for example, 0 to 5.9 N/200 mm, more preferably 0.1 to 3 N/200 mm, and even more preferably 0.5 to 2 N/200 mm. The adhesive force is, specifically for example, 0, 0.1, 0.5, 1.0, 1.5, 2.0, 2.5, 3.0, 3.5, 4.0, 4.5, 5.0, 5.5, or 5.9 N/200 mm, and may be in the range between the two values exemplified herein. In addition, the adhesive force under the above-described measurement conditions before heating is preferably 5 N/200 mm or lower. This adhesive force is, for example, 0 to 5 N/200 mm, specifically for example, 0, 0.1, 0.5, 1, 2, 3, 4, or 5 N/200 mm, and may be in the range between the two values exemplified herein.

The acrylic resin means a resin in which the ratio of the (meth)acrylic monomer unit contained in the resin is 50 mass % or more. The (meth)acrylic monomer means a compound having a (meth)acryloyl group. The (meth)acrylic monomer is preferably monofunctional.

Examples of the (meth)acrylic monomer include (meth)acrylic acids and/or (meth)acrylic esters. Examples of the (meth)acrylic ester include alkyl (meth)acrylates, hydroxyalkyl (meth)acrylates, and (meth)acrylates having a cyclic ether skeleton. These may be used alone or in combination.

As the alkyl (meth)acrylate, (meth)acrylates represented by the general formula (A) shown below are preferred.

$$Z\text{-}O\text{-}R \qquad (A)$$

In the general formula, Z represents a (meth)acryloyl group, and R represents an alkyl group having 1 to 10 carbon atoms.

Examples of such alkyl (meth)acrylates include methyl (meth)acrylate, ethyl (meth)acrylate, propyl (meth)acrylate, 2-ethylhexyl (meth)acrylate, isopropyl (meth)acrylate, butyl (meth)acrylate, isobutyl (meth)acrylate, isooctyl (meth) acrylate, isononyl (meth)acrylate, lauryl (meth)acrylate, and dodecyl (meth)acrylate.

Examples of the hydroxyalkyl (meth)acrylate include 2-hydroxypropyl (meth)acrylate, 2-hydroxybutyl (meth) acrylate, 2-hydroxyethyl (meth)acrylate, and glycerol mono (meth)acrylate.

Examples of the (meth)acrylate having a cyclic ether skeleton include glycidyl (meth)acrylate, furfuryl (meth) acrylate, tetrahydrofuryl (meth)acrylate, 3-ethyl-3-oxetanyl methyl (meth)acrylate, (2-methyl-ethyl-1,3-dioxolan-4-yl) methyl (meth)acrylate, cyclic trimethylolpropane formal (meth)acrylate, γ-butyrolactone (meth)acrylate, dioxolane (meth)acrylate, dioxane glycol di(meth)acrylate, and oxetane (meth)acrylate. One or more kinds of these can be used. Among cyclic ether skeletons, 5 to 6 membered rings are preferred. The cyclic ether skeleton preferably has one oxygen atom. The cyclic ether skeleton preferably has 2 to 5 carbon atoms. Among (meth)acrylates having a cyclic ether skeleton, glycidyl (meth)acrylate is preferred.

The acrylic resin may contain only (meth)acrylic monomer unit, or other monomer units other than the (meth) acrylic monomer unit. Examples of other monomer units include olefins such as ethylene and propylene, aliphatic vinyls such as vinyl acetate, and aromatic vinyls such as styrene.

The ratio of the (meth)acrylic monomer unit in the acrylic resin configuring the surface treatment layer 1*b* is, for example, 50 to 100 mass %, specifically for example, 50, 55, 60, 65, 70, 75, 80, 85, 90, 95, or 100 mass %, and may be in the range between the two values exemplified herein.

The acrylic resin can be obtained by polymerizing a monomer mixture containing the above-described monomer.

The acrylic resin composition preferably contains a cross-linking agent. The acrylic resin is cross-linked by the reaction of the acrylic resin and the cross-linking agent. Examples of the cross-linking agent include acrylate-based cross-linking agents, isocyanate-based cross-linking agents, epoxy-based cross-linking agents, and amine-based cross-linking agents. These may be used alone, or two or more kinds of these may be used in combination.

Examples of the acrylate-based cross-linking agent include compounds having a plurality of (e.g., two) (meth) acryloyl groups, such as 1,9-nonanediol diacrylate, 1,6-hexanediol diacrylate, triethylene glycol diacrylate, polytetramethylene glycol diacrylate, neopentyl glycol diacrylate, and 3-methyl-1,5 pentanediol diacrylate. Examples of the isocyanate-based cross-linking agent include multivalent isocyanate compounds such as 2,4-tolylenediisocyanate, 2,6-tolylenediisocyanate, 1,3-xylylenediisocyanate, 1,4-xylenediisocyanate, diphenylmethane-4,4'-diisocyanate, diphenylmethane-2,4'-diisocyanate, 3-methyl diphenylmethane diisocyanate, hexamethylene diisocyanate, isophorone diisocyanate, dicyclohexylmethane-4,4'-diisocyanate, dicyclohexylmethane-2,4'-diisocyanate, and lysine isocyanate; and derivatives thereof (adduct product, biuret product, isocyanurate product). These may be used alone, or two or more kinds of these may be used in combination.

The blending amount of the cross-linking agent to 100 parts by mass of the acrylic resin is, for example, 0.5 to 30 parts by mass, preferably 4 to 25 parts by mass, and more preferably 7 to 20 parts by mass. The blending amount is, specifically for example, 0.5, 1, 2, 3, 4, 5, 6, 7, 8, 9, 10, 15, 20, 25, or 30 parts by mass, and may be in the range between the two values exemplified herein.

The acrylic resin is cross-linked by light irradiation or heating.

In the case of cross-linking by light irradiation, the acrylic resin composition preferably contains a photopolymerization initiator. Specific examples of the photopolymerization initiator that can be used include benzoin ether-based photopolymerization initiators, acetophenone-based photopolymerization initiators, α-ketol-based photopolymerization initiators, aromatic sulfonyl chloride-based photopolymerization initiators, photoactive oxime-based photopolymerization initiators, benzoin-based photopolymerization initiators, benzyl-based photopolymerization initiators, benzophenone-based photopolymerization initiators, ketal-based photopolymerization initiators, thioxanthone-based photopolymerization initiators, and acylphosphine oxide-based photopolymerization initiators, but are not limited thereto. The acetophenone-based photopolymerization initiators are preferred.

Specific examples of the acetophenone-based photopolymerization initiator include 1-hydroxycyclohexylphenyl ketone, 4-phenoxydichloroacetophenone, 4-t-butyl-dichloroacetophenone, 1-[4-(2-hydroxyethoxy)-phenyl]-2-hydroxy-2-methyl-1-propan-1-one, 2-hydroxy-2-methyl-1-phenyl-propan-1-one, and methoxyacetophenone.

The Mw of the acrylic resin before cross-linking is preferably 300000 to 2000000, and more preferably 450000 to 800000. When the Mw is too low, the heat resistance may be insufficient. When the Mw is too high, the viscosity may be too high, making coating difficult and thus reducing productivity. The Mw is, specifically for example, 300000, 350000, 400000, 450000, 500000, 550000, 600000, 650000, 700000, 750000, 800000, 900000, 1000000, 1100000, 1200000, 1300000, 1400000, 1500000, 1600000, 1700000, 1800000, 1900000, or 2000000, and may be in the range between the two values exemplified herein.

The glass transition temperature (Tg) of the acrylic resin before cross-linking is preferably −15 to 40° C., and more preferably −10 to 30° C. This Tg is, specifically for example, −15, −10, −5, 0, 5, 10, 15, 20, 25, 30, 35, or 40° C., and may be in the range between the two values exemplified herein. The glass transition temperature (Tg) of the acrylic resin after cross-linking is preferably 10 to 80° C., and more preferably 20 to 70° C. This Tg is, specifically for example, 10, 15, 20, 25, 30, 35, 40, 45, 50, 55, 60, 65, 70, 75, or 80° C., and may be in the range between the two values exemplified herein.

In the present specification, the Tg is measured as follows. Differential scanning calorimetry (DSC) measurement is performed in accordance with JIS K 7121: 1987. Then, the intersection of the tangent line of the baseline in the DSC curve and the tangent line of the steeply descending position of the endothermic region due to glass transition is taken as the Tg.

The storage modulus at 180° C. of the surface treatment layer **1*b* is preferably $1.0\times10^4$ Pa to $1.0\times10^8$ Pa. If the storage modulus is too low, the surface treatment layer 1*b* becomes too soft by heating the adhesive sheet 10 when a wafer is adhered to the adhesive sheet 10. As a result, the surface treatment layer 1*b* may break as the cushion layer 1*a* melts, leaving residue of the surface treatment layer 1*b* on the wafer and impairing peelability. If the storage modulus is too high, the surface treatment layer 1*b* may be too hard, which may deteriorate the followability of the base material layer 1 to the convex part 5**.

The storage modulus is, specifically for example, $1.0\times10^4$ Pa, $1.0\times10^5$ Pa, $1.0\times10^6$ Pa, $1.0\times10^7$ Pa, or $1.0\times10^8$ Pa, and may be in the range between the two values exemplified herein.

The thickness of the surface treatment layer **1*b* is, for example, 0.1 to 10 μm, preferably 0.5 to 5 μm, and more preferably 1 to 4 μm. When the surface treatment layer 1*b* has such a thickness, the effect of providing the surface treatment layer 1*b*** is likely to be exhibited properly. The thickness is, specifically for example, 0.1, 0.5, 1.0, 1.5, 2.0, 2.5, 3.0, 3.5, 4.0, 5.0, 6.0, 7.0, 8.0, 9.0, or 10.0 μm, and may be in the range between the two values exemplified herein.

<Barrier Layer **1*c***>

The barrier layer **1*c* is a layer to reduce the oxygen permeability of the base material layer 1. When the base material layer 1 is easily permeable to air, outside air may enter a sealed space 2*b* through the base material layer 1, making it difficult to depressurize the sealed space 2*b*, which may result in the deterioration of the followability of the base material layer 1 to the convex part 5**.

The barrier layer **1*c* is a layer with low oxygen permeability. When oxygen permeability is low, air permeability is also normally low. Therefore, outside air is suppressed from entering the sealed space 2*b* through the base material layer 1 by providing the barrier layer 1*c*, thereby exhibiting the effect that the base material layer 1 becomes easy to follow the convex part 5**.

Preferably, the barrier layer **1*c* is provided such that the oxygen permeability of the base material 1 at 25° C. and at RH0%, which is measured based on JIS K 7126-2 (isobaric method), is 1000 ml/($m^2$·24 h·atm) or lower. Preferably, the oxygen permeability of the barrier layer 1*c* alone under the same conditions is 1000 ml/($m^2$·24 h·atm) or lower to make the oxygen permeability of the base material 1 within such a range. In this case, the above-described effect is likely to be exhibited. The oxygen permeability of the base material 1 or the barrier layer 1***c* is, for example, 0 to 1000 ml/($m^2$·24 h·atm), preferably 0 to 500 ml/($m^2$·24 h·atm), specifically for example, 0, 100, 200, 300, 400, 500, 600, 700, 800, 900, or 1000 ml/($m^2$·24 h·atm), and may be in the range between the two values exemplified herein.

The oxygen permeability of the barrier layer 1*c* under the above-described conditions is preferably lower than that of the cushion layer 1*a*. The value of (oxygen permeability of the cushion layer 1*a*—oxygen permeability of the barrier layer 1*c*) is preferably 100 ml/($m^2$·24 h·atm) or higher. The value is, for example, 100 to 3000 ml/($m^2$·24 h·atm), specifically for example, 100, 500, 1000, 1500, 2000, 2500, or 3000 ml/($m^2$·24 h·atm), and may be in the range between the two values exemplified herein.

The barrier layer 1*c* can be formed of any material capable of achieve the above-described oxygen permeability, and polyester (e.g., polyethylene terephthalate), polyimide, and polyamide are preferred from the viewpoint of easily reducing the oxygen permeability.

The thickness of the barrier layer 1*c* is, for example, 5 to 50 μm, and preferably 10 to 30 μm. When the barrier layer 1*c* is too thin, the oxygen permeability of the base material layer 1 may not be sufficiently low. When the barrier layer 1*c* is too thick, the followability of the base material 1 to the convex part 5 may deteriorate. The thickness is, specifically for example, 5, 10, 15, 20, 25, 30, 35, 40, 45, or 50 μm, and may be in the range between the two values exemplified herein.

2. Adhesive Layer 2

The adhesive layer 2 is a layer for adhering the adhesive sheet 10 to the semiconductor wafer 4, and is formed of an adhesive. The adhesive layer 2 has an opening part 2*a* with a diameter smaller than the diameter of the semiconductor wafer 4. In other words, the adhesive layer 2 is ring-shaped. The opening part 2*a* is a part where no adhesive is provided, and has a diameter smaller than the diameter of the semiconductor wafer 4. The diameter of the opening part 2*a*/diameter of the semiconductor wafer 4 is preferably 0.950 to 0.995, and more preferably 0.960 to 0.990.

The adhesive layer 2 is adhered to an outer peripheral part 4*a* of the semiconductor wafer 4 so that the convex part 5 of the wafer 4 is placed in the opening part 2*a*. Therefore, the convex part 5 is not in contact with the adhesive, and adhesive residue on the convex part 5 is prevented.

The width of the adhesive layer 2 is preferably 10 to 100 mm, and more preferably 30 to 70 mm. The thickness of the adhesive layer 2 is preferably 1 to 100 μm, and more preferably 5 to 50 μm. The thickness is, specifically for example, 1, 5, 10, 15, 20, 25, 30, 35, 40, 45, 50, 100 μm, and may be in the range between the two values exemplified herein.

The adhesive layer 2 is formed of an acrylic resin composition containing an acrylic resin. The composition of the acrylic resin of the adhesive layer 2 may be the same as or different from that of the acrylic resin of the surface treatment layer 1*b*.

The ratio of the (meth)acrylic monomer unit contained in the acrylic resin configuring the adhesive layer 2 is, for example, 50 to 100 mass %, specifically for example, 50, 55, 60, 65, 70, 75, 80, 85, 90, 95, or 100 mass %, and may be in the range between the two values exemplified herein.

Examples of the (meth)acrylic monomer include monomers having hydroxyl groups such as 2-hydroxyethyl (meth) acrylate, 2-hydroxypropyl (meth)acrylate, and 2-hydroxybutyl (meth)acrylate; monomers having carboxyl groups such as (meth)acrylic acid, crotonic acid, maleic acid, itaconic acid, fumaric acid, acrylamide N-glycolic acid, and cinnamic acid; and monomers having epoxy groups such as allyl glycidyl ether, and (meth)acrylic acid glycidyl ether, as a (meth)acrylic monomer or monomer containing functional groups such as butyl (meth)acrylate, 2-butyl (meth)acrylate, t-butyl (meth)acrylate, pentyl (meth)acrylate, octyl (meth) acrylate, 2-ethylhexyl (meth)acrylate, nonyl (meth)acrylate, decyl (meth)acrylate, lauryl (meth)acrylate, methyl (meth) acrylate, ethyl (meth)acrylate, isopropyl (meth)acrylate, tridecyl (meth)acrylate, myristyl (meth)acrylate, cetyl (meth) acrylate, stearyl (meth)acrylate, cyclohexyl (meth)acrylate, benzyl (meth)acrylate, dimethyl acrylamide, diethyl acrylamide, acryloyl morpholine, and isobornyl acrylate.

The cross-linking agent is preferably blended in the acrylic resin composition configuring the adhesive layer 2. Examples of the cross-linking agent include polyfunctional isocyanate cross-linking agents and polyfunctional epoxy cross-linking agents. When the cross-linking agent reacts with the functional group, the cross-linked structure with the functional groups as base points is formed, which increases cohesive force of the adhesive and suppresses adhesive residue. In addition, (meth)acrylate with one or more (meth) acroylated ends or side chains of oligomer/polymer such as 1,2-polybutadiene-terminated urethane (meth)acrylate, hydrogenated product thereof, 1,4-polybutadiene-terminated urethane (meth)acrylate, polyisoprene-terminated (meth)acrylate, polyester-based urethane (meth)acrylate, polyether-based urethane (meth)acrylate, polyester (meth) acrylate, and bis-A epoxy (meth)acrylate may be used.

The blending amount of the cross-linking agent to 100 parts by mass of the acrylic resin is, for example, 0.1 to 10 parts by mass, preferably 0.5 to 8 parts by mass, and more preferably 1 to 6 parts by mass. The blending amount is, specifically for example, 0.1, 0.5, 1.0, 1.5, 2.0, 2.5, 3.0, 3.5, 4.0, 4.5, 5.0, 5.5, 6.0, 6.5, 7.0, 7.5, 8.0, 8.5, 9.0, 9.5, or 10.0 parts by mass, and may be in the range between the two values exemplified herein.

The glass transition temperature (Tg) of the acrylic resin after cross-linking is preferably −30 to 5° ° C., and more preferably −25 to −5° C. The Tg is, specifically for example, −30, −25, −20, −15, −10, −5, 0, or 5° C., and may be in the range between the two values exemplified herein.

The adhesive layer 2 can be formed by applying the adhesive onto the base material layer 1 for coating, or by applying the adhesive onto a release film and then transferring it to the base material layer 1, for example, using a general coating method such as comma coating, gravure coating, roll coating, and screen coating.

The adhesive force measured in accordance with JIS Z0237 at 23° C. between the adhesive layer 2 and the semiconductor wafer after heating the semiconductor wafer to which the adhesive layer 2 is adhered for 1 minute at 100° C. and cooling to room temperature is preferably 6 to 50 N/200 mm, and more preferably 10 to 30 N/200 mm. In addition, the adhesive force under the above-described measurement conditions before heating is preferably 6 N/200 mm or higher, for example, 6 to 50 N/200 mm. These adhesive forces are, specifically for example, 6, 10, 15, 20, 25, 30, 35, 40, 45, or 50 N/200 mm, and may be in the range between the two values exemplified herein.

<Semiconductor Wafer 4>

The semiconductor wafer 4 has a convex part 5. The convex part 5 is an arbitrary structure that protrudes in the out-of-plane direction of the semiconductor wafer 4. Examples of the convex part 5 include a protruding electrode, and the convex part of a circuit having unevenness.

Examples of the semiconductor wafer 4 include not only a silicon wafer but also a germanium wafer, a gallium-arsenide wafer, a gallium-phosphorus wafer, and a gallium-arsenide aluminum wafer. The diameter of the semiconductor wafer 4 is preferably 1 to 16 inches, and more preferably 4 to 12 inches. The thickness of the semiconductor wafer 4 is preferably 500 to 800 μm, and more preferably 520 to 775 μm, but is not limited thereto.

The height of the convex part 5 is preferably 10 to 500 μm, and more preferably 100 to 300 μm. The height is, specifically for example, 10, 50, 100, 150, 200, 250, 300, 350, 400, 450, or 500 μm, and may be in the range between the two values exemplified herein.

The semiconductor wafer 4 preferably has the outer peripheral part 4*a* where the convex part 5 is not provided. The width of the outer peripheral part 4*a* is preferably 1.0 to 3.0 mm, and more preferably 1.5 to 2.5 mm.

Examples of final products using the semiconductor wafers 4 having the convex part 5 include electronic components for logic, memory, sensor, power supply, or the like.

<Curable Resin 8>

The curable resin 8 is a resin that is cured by stimulus such as energy rays (e.g., ultraviolet rays) or heat. The curable resin 8 is placed between the cushion layer 1 and a support film 7.

The viscosity of the curable resin 8 before curing is preferably 100 to 3000 mPa·s, and more preferably 200 to 1000 mPa·s. When the viscosity is 100 mPa·s or higher, the curable resin 8 has not a surface contact but a point contact, which suppresses air bubble mixing in the pressing step, resulting in excellent grindability. When the viscosity is 3000 mPa·s or lower, the curable resin 8 is less likely to entangle air bubbles when it flows between the adjacent convex parts 5, resulting in excellent grindability. The viscosity is measured using an E-type viscometer under the conditions of 23° ° C. and 50 rpm.

The Shore D hardness of the curable resin 8 after curing is preferably 5 to 70, and more preferably 10 to 60. When the Shore D hardness is 5 or more, the retentivity of the convex part 5 is high, resulting in excellent grindability. When the Shore D hardness is 70 or less, it is easy to bend the adhesive sheet 10 when peeling the adhesive sheet 10 from the semiconductor wafer 4. The Shore D hardness is measured under the conditions in accordance with JIS K 6253.

The curable resin 8 is preferably a light curable resin, and more preferably a UV curable resin.

The curable resin 8 is preferably based on an acrylic resin, and the composition thereof is not particularly limited. The curable resin containing 1,2-hydrogenated polybutadiene-terminated urethane (meth)acrylate, isobornyl acrylate, and diethylacrylamide is preferred because it can improve the adhesion between the base material layer 1 and the support film 7.

Curing shrinkage rate of the curable resin 8 is preferably 7% or less.

When the height of the convex part 5 is taken as Td (μm), the thickness of the curable resin 8 is preferably (Td+20) to (Td+200) μm, and more preferably (Td+50) to (Td+150) μm.

<Support Film 7>

The support film 7 is an arbitrary film that can support the curable resin 8 and can be formed of polyolefin such as ethylene vinyl acetate, polyethylene, polypropylene, polybutene, and polybutadiene, or polyvinyl chloride, polyethylene terephthalate, polyethylene naphthalate, polystyrene, polycarbonate, polyimide, or the like.

The thickness of the support film 7 is preferably 10 to 300 μm, and more preferably 30 to 250 μm.

2. Method for Manufacturing Semiconductor Wafer

FIGS. 1 to 9 illustrate a method for manufacturing a semiconductor wafer using the adhesive sheet 10. This method includes a frame adhering step, a heating step, a cutting step, a resin curing step, a grinding step, and a peeling step. The order in which these steps are performed is not limited thereto, and the order can be exchanged as appropriate. Hereinafter, each step will be described.

<Frame Adhering Step>

As shown in FIGS. 1 to 2, in the frame adhering step, the adhesive sheet 10 is adhered to the ring frame 3. The ring frame 3 has an opening part 3*a* having a diameter larger than the diameter of the opening part 2*a* of the adhesive layer 2, and the ring frame 3 can be adhered to the adhesive layer 2. This allows the adhesive sheet 10 to be held stably by the ring frame 3, making it easier to handle the adhesive sheet 10.

<Wafer Adhering Step and Heating Step>

Figure 3:
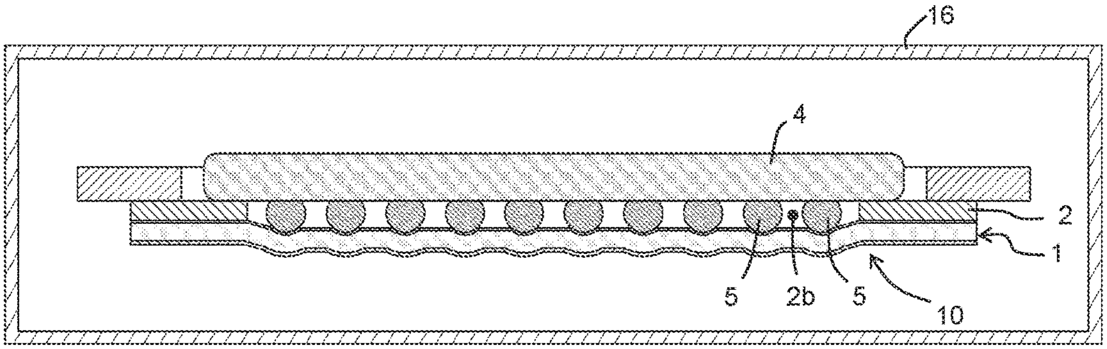
FIG. 3 is a cross-sectional view showing a state after adhering a semiconductor wafer 4 to the adhesive sheet 10 and placing it inside a decompression chamber 16 from the state in FIG. 2.

As shown in FIGS. 2 to 3, in the wafer adhering step, the adhesive sheet 10 is adhered to the outer peripheral part 4*a* of the semiconductor wafer 4 under reduced pressure, the outer peripheral part 4*a* on the surface of the semiconductor wafer 4 where the convex part 5 is provided. The width of the adhering surface where the semiconductor wafer 4 is adhered to the adhesive layer 2 is preferably 1.0 to 3.0 mm, and more preferably 1.5 to 2.5 mm.

This step can be performed by adhering the adhesive sheet 10 to the semiconductor wafer 4 in a decompression chamber 16. The pressure in the decompression chamber 16 should be lower than atmospheric pressure, preferably 1000 Pa or lower, more preferably 500 Pa or lower, and even more preferably 100 Pa or lower. The lower limit of the pressure in the decompression chamber 16 is, for example, 10 Pa, but is not limited thereto.

By adhering the adhesive sheet 10 to the semiconductor wafer 4 under reduced pressure in this way, the inside of the sealed space 2*b* surrounded by the semiconductor wafer 4 and the adhesive sheet 10 becomes in a depressurized state.

Figure 4:
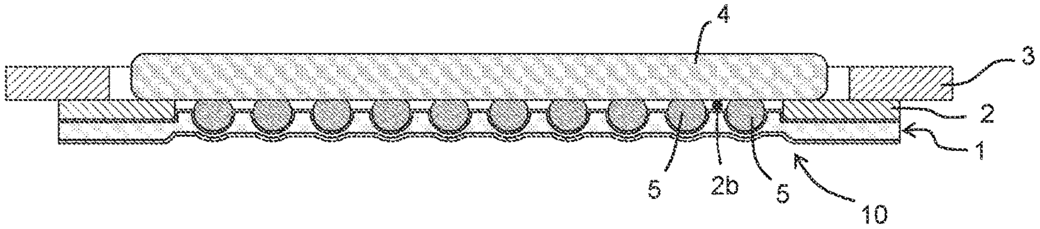
FIG. 4 is a cross-sectional view showing a state after removing the semiconductor wafer 4 to which the adhesive sheet 10 is adhered from the decompression chamber 16 from the state in FIG. 3.

In that state, when the adhesive sheet 10 adhered to the semiconductor wafer 4 is removed from the decompression chamber 16 and exposed to atmospheric pressure, the base material layer 1 is pushed by atmospheric pressure and attempts to enter the inside of the sealed space 2*b*. When the base material layer 1 is not in a heated state, it has high rigidity and therefore hardly enters the sealed space 2*b*. On the other hand, in the heating step, when the base material layer 1 is heated to 60 to 150° C., the base material layer 1 is softened and enters the inside of the sealed space 2*b*, as shown in FIG. 4. As a result, the convex part 5 is embedded in the base material layer 1, and the convex part 5 is protected by the base material layer 1. The ratio of the height of the embedded part of the convex part 5/the entire height of the convex part 5 is preferably 0. 2 to 1, more preferably 0.5 to 1, and even more preferably 0.8 to 1. The heating temperature of the base material layer 1 is preferably 80 to 120° C. The heating time of the base material layer 1 is preferably 3 to 120 seconds, and more preferably 5 to 60 seconds.

The heating of the base material layer 1 may be performed before or after adhering the semiconductor wafer 4 to the adhesive sheet 10. The heating may be performed inside or outside the decompression chamber 16.

<Cutting Step>

As shown in Fings. 4 to 5, in the cutting step, the adhesive sheet 10 is cut along the outer periphery of the semiconductor wafer 4. As a result, the adhesive sheet 10 adhered to the semiconductor wafer 4 is separated from the ring frame 3. The cutting step can be performed after the resin curing step.

<Resin Curing Step>

In the resin curing step, the base material layer 1 is brought in contact with the curable resin 8 after the wafer adhering step, and the curable resin 8 is cured in that state. In an example, this step can be performed by the following method.

Figure 5:
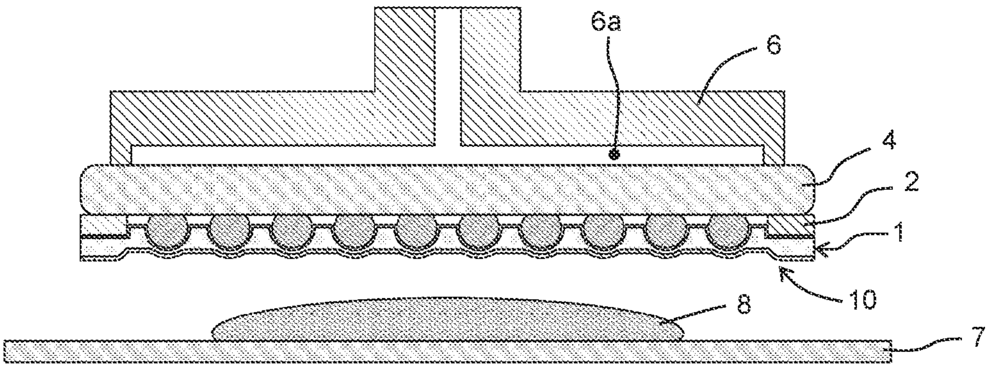
FIG. 5 is a cross-sectional view showing a state after removing the ring frame 3 and sucking the semiconductor wafer 4 by a decompression unit 6 from the state in FIG. 4.
Figure 6:
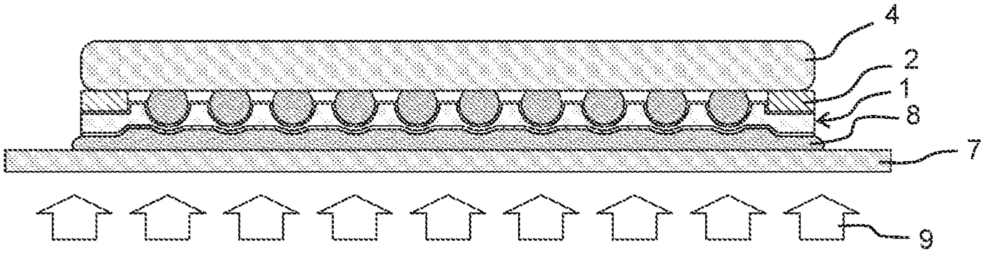
FIG. 6 is a cross-sectional view showing a state in which the adhesive sheet 10 is pressed against a curable resin 8 and the curable resin 8 is being cured from the state in FIG. 5.

First, as shown in FIGS. 5 to 6, the curable resin 8 is pressed and spread by moving the adhesive sheet 10 with the adhesive sheet 10 facing the curable resin 8 supplied on the support film 7.

In an example, the semiconductor wafer 4 is sucked on the decompression unit 6 having decompression holes 6*a*, and the adhesive sheet 10 is pressed against the curable resin 8 in that state. In that state, the curable resin 8 is pressed and spread by moving the adhesive sheet 10 along the surface of the support film 7.

Figure 7:
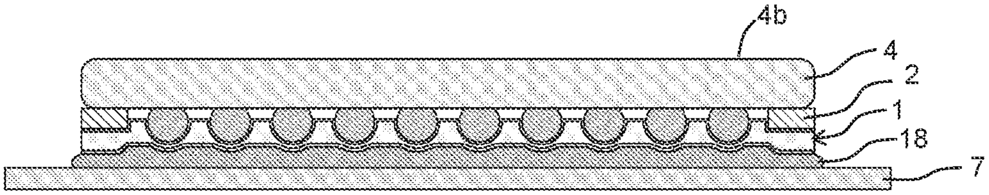
FIG. 7 is a cross-sectional view showing a state after completion of curing the curable resin 8 from the state in FIG. 6.

Next, as shown in FIGS. 6 to 7, the curable resin 8 is cured with the base material layer 1 in contact with the curable resin 8.

In an example, the curable resin 8 can be cured into a cured resin 18 by irradiating the curable resin 8 with energy rays 9 such as ultraviolet rays through the support film 7. This allows the adhesive sheet 10 to be held stably on the support film 7.

<Grinding Step>

Figure 8:
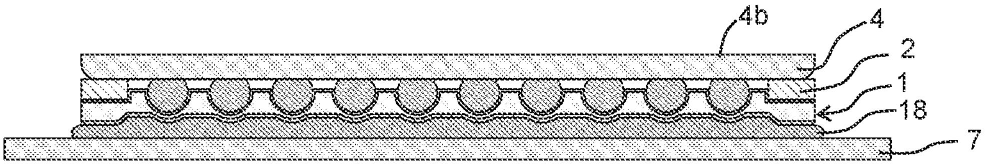
FIG. 8 is a cross-sectional view showing a state after grinding a backside 4*b* of the semiconductor wafer 4 from the state in FIG. 7.

As shown in FIGS. 7 to 8, the backside 4*b* of the semiconductor wafer 4 is ground in the grinding step.

The backside 4*b* of the semiconductor wafer 4 is a surface opposite to the surface where the convex part 5 is provided. There are no restrictions on the methods for grinding the backside of the wafer, and any known grinding method can be used. The grinding is preferably performed while water is applied to the wafer and a grinding wheel (e.g., diamond wheel) to cool them down. The thickness of the wafer that was made thinner by the grinding is preferably 300 μm or smaller, and more preferably 50 μm or smaller.

During back grinding, the convex part 5 is easily damaged because an in-plane directional load of the semiconductor wafer 4 is applied to the convex part 5. However, in the present embodiment, since at least a part of the convex part 5 is embedded in the base material layer 1 and the curable resin 8 cured, the convex part 5 is stably supported by the base material layer 1 and the curable resin 8 cured, and therefore the convex part 5 is hardly damaged.

<Peeling Step>

Figure 9:
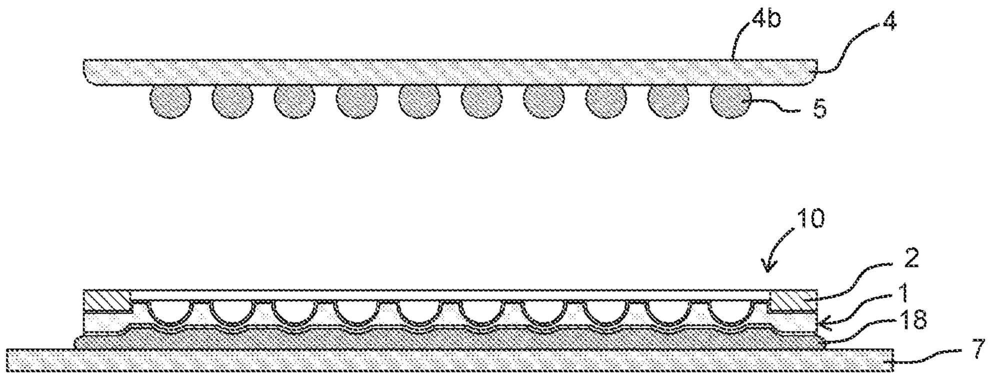
FIG. 9 is a cross-sectional view showing a state after peeling the semiconductor wafer 4 from the adhesive sheet 10 from the state in FIG. 8.

As shown in FIGS. 8 to 9, in the peeling step, the adhesive sheet 10 is peeled from the semiconductor wafer 4. The peeling of the adhesive sheet 10 can be performed by bending the adhesive sheet 10 in the direction in which the sheet 10 moves away from the semiconductor wafer 4.

This completes the back grinding step of the semiconductor wafer 4. When the back grinding is performed using an adhesive sheet in such a form where the convex part 5 is in contact with the adhesive, the adhesive may be adhered to the convex part 5. However, in the present embodiment, adhesion of the adhesive to the convex part 5 is suppressed because the convex part 5 is not in contact with the adhesive layer 2.

The dicing step may be performed before the peeling step. In the dicing step, the semiconductor wafer 4 is divided into a plurality of semiconductor chips by dicing the semiconductor wafer 4. The dicing method is not particularly limited, and may be any method such as blade dicing, laser dicing, stealth dicing, and plasma dicing.

When the dicing step is performed, a plurality of semiconductor chips is adhered to the adhesive sheet 10. Therefore, the peeling step is a step where each of the plurality of semiconductor chips is peeled from the adhesive sheet 10.

3. Base Material Sheet

Figure 10:
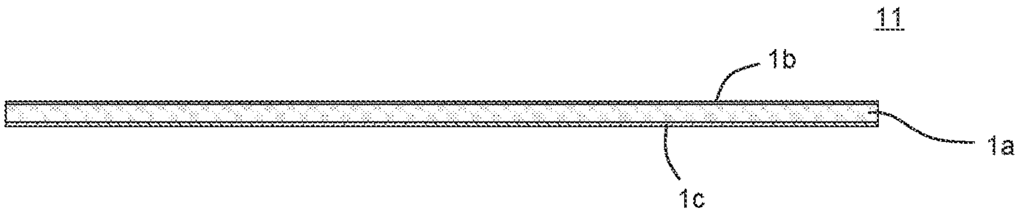
FIG. 10 is a cross-sectional view showing a base material sheet 11 of one embodiment of the present invention.

As shown in FIG. 10, the base material sheet 11 of one embodiment of the present invention can have the same configuration as that of the base material layer 1. In other words, the base material sheet 11 has the cushion layer 1*a* and the surface treatment layer 1*b* provided thereon, the surface treatment layer 1*b* is formed of the acrylic resin composition containing the acrylic resin, and the acrylic resin is cross-linked by light irradiation or heating. The base material sheet 11 may have the barrier layer 1*c*. The descriptions of the base material layer 1, the cushion layer 1*a*, the surface treatment layer 1*b*, and the barrier layer 1*c* are the same as those in "1-1. Base Material Layer 1".

The base material sheet 11 can be used as the base material layer 1 of the adhesive sheet 10 for back grinding of the semiconductor wafer 4 having the convex part 5. The base material sheet 11 can also be used as a sheet for grinding the backside of the semiconductor wafer 4 having the convex part 5 without providing the adhesive layer 2 in the adhesive sheet 11. In this case, for example, the base material sheet 11 can be adhered to the semiconductor wafer 4 by the action of atmospheric pressure, by removing the base material sheet 11 and the semiconductor wafer 4 from the decompression chamber 16 after depressurizing the inside of the sealed space 2*b* formed by pressing the base material sheet 11 against the semiconductor wafer 4 in the decompression chamber 16 as described above in <Wafer Adhering Step and Heating Step> in "2. Method for Manufacturing Semiconductor Wafer". A ring-shaped packing having the same shape as the adhesive layer 2 may be placed between the base material sheet 11 and the semiconductor wafer 4 to form the sealed space 2*b*.

EXAMPLE

1. Manufacture of Adhesive Sheet 10

Example 1

In Example 1, the adhesive sheet 10 was manufactured by forming the surface treatment layer 1*b* on the cushion layer 1*a* and forming the ring-shaped adhesive layer 2 having the opening part 2*a* on the surface treatment layer 1*b*.

More detailed descriptions are as follows.

Preparation of Cushion Layer 1*a*

First, the cushion layer 1*a* configured of a 150 μm-thick metal ion crosslinked material of the ethylene-methacrylic acid copolymer (FUNCRARE HMD, made by Gunze Limited) was prepared. The ethylene-methacrylic acid copolymer had a methacrylic acid unit ratio of 15 mass %, an MFR (JIS K7210, 125° C./10.0 kg load) of 5 g/10 min, and a melting point (JIS K7121) of 72° C.

Formation of Surface Treatment Layer 1*b*

As constituent monomers, 80 parts by mass of ethyl acrylate, 12 parts by mass of methyl methacrylate, 5 parts by mass of 2-hydroxyethyl methacrylate, and 3 parts by mass of glycidyl methacrylate was polymerized to obtain the acrylic copolymer, and the surface treatment agent was prepared by adding 12 parts by mass of the cross-linking agent (LIGHT-ACRYLATE 1.9ND-A, made by KYOEISHA CHEMICAL Co., Ltd) and 1 part by mass of the photopolymerization initiator (Omnirad 184, made by BASF) to 100 parts by mass of this acrylic copolymer. The acrylic copolymer had a Mw of 600000 and a Tg of −7° C. before cross-linking and a Tg of 32° C. after cross-linking.

Next, the surface treatment agent was applied onto the cushion layer 1*a* for coating and UV irradiation was performed to form the 2 μm-thick surface treatment layer 1*b*.

Formation of Adhesive Layer 2

54.4 parts by mass of hydrogenated polybutadiene diacrylate (product name: BAC-45, made by OSAKA ORGANIC CHEMICAL INDUSTRY LTD.), 13.6 parts by mass of isodecyl acrylate (product name: IDAA, made by OSAKA ORGANIC CHEMICAL INDUSTRY LTD.), 32 parts by mass of isobonyl acrylate (product name: IBXA, made by OSAKA ORGANIC CHEMICAL INDUSTRY LTD.), 7 parts by mass of α-aminoalkylphenone (product name: Omnilad 379EG, made by BASF) as photopolymerization initiator, 3 parts by mass of vinylether polymer (FLOWLEN AC-903, made by KYOEISHA CHEMICAL Co., Ltd) as an antifoaming agent, and 3 parts by mass of isocyanate (product name: TPA-100, made by Asahi Kasei Corp.) as a cross-linking agent were added to prepare the liquid composition. This composition was screen-printed on the surface treatment layer 1*b* in a specific shape, and after UV irradiation, aging was performed at 40° ° C. for 4 days to form the 10 μm-thick ring-shaped adhesive layer 2.

Example 2

The adhesive sheet 10 was manufactured in the same way as in Example 1, except that the surface treatment layer 1*b* was formed after corona discharge treatment was applied to the cushion layer 1*a*.

Example 3

The adhesive sheet 10 was manufactured in the same way as in Example 1, except that the surface treatment layer 1*b* was formed by the following method.

Formation of Surface Treatment Layer 1*b*

As constituent monomers, 50 parts by mass of ethyl acrylate, 42 parts by mass of methyl methacrylate, 5 parts by mass of 2-hydroxyethyl methacrylate, and 3 parts by mass of glycidyl methacrylate was polymerized to obtain the acrylic copolymer, and the surface treatment agent was prepared by adding 2 parts by mass of the cross-linking agent (CORONATE L-45E, made by Nippon Polyurethane Industry Co., Ltd.) to 100 parts by mass of this acrylic copolymer. The acrylic copolymer had a Mw of 600000 and a Tg of 24° ° C. before cross-linking and a Tg of 61° C. after cross-linking.

Next, the surface treatment agent was applied onto the cushion layer 1*a* for coating and heated at 40° ° C. for 7 days to form the 2 μm-thick surface treatment layer 1*b*.

Example 4

The adhesive sheet 10 was manufactured in the same way as in Example 3, except that the surface treatment layer 1*b* was formed after corona discharge treatment was applied to the cushion layer 1*a*.

Comparative Example 1

The adhesive sheet 10 was manufactured in the same way as in Example 1, except that the adhesive layer 2 was formed on the cushion layer 1*a* without forming the surface treatment layer 1*b*.

Comparative Example 2

The adhesive sheet 10 was manufactured in the same way as in Example 2, except that the adhesive layer 2 was formed on the cushion layer 1*a* without forming the surface treatment layer 1*b*.

Comparative Example 3

The adhesive sheet 10 was manufactured in the same way as in Example 2, except that the surface treatment layer 1*b* was formed by the following method.

Formation of Surface Treatment Layer 1*b*

As constituent monomers, 50 parts by mass of ethyl acrylate, 42 parts by mass of methyl methacrylate, 5 parts by mass of 2-hydroxyethyl methacrylate, and 3 parts by mass of glycidyl methacrylate were polymerized, and this polymer was used as a surface treatment agent and applied onto the cushion layer 1*a* for coating to form the surface treatment layer 1*b*.

Comparative Example 4

The adhesive sheet 10 was manufactured in the same way as in Example 2, except that the adhesive layer 2 was formed by the following method.

Formation of Adhesive Layer 2

After dissolving in toluene 100 parts by mass of natural rubber (Mooney viscosity 75), 30 parts by mass of SIS (product name: Quintac 3460C, made by ZEON Corporation, radial-structured SIS, styrene content of 25 wt. %), and 40 parts by mass of maleic anhydride modified C5,C9 resin (product name: Quintone D-200, made by ZEON Corporation), 3 parts by mass of aromatic isocyanate (product name: CORONATE L, made by Nippon Polyurethane Industry Co., Ltd.) was added as the cross-linking agent to prepare the rubber-based adhesive composition in solution form. This composition was applied onto the separator for coating, and heated and cured to obtain the 10 μm-thick adhesive film. The obtained adhesive film was punched into a shape having an opening part and adhered onto the surface treatment layer to form the 10 μm-thick ring-shaped adhesive layer 2.

2. Back Grinding of Semiconductor Wafer

The back grinding of semiconductor wafer 4 was performed by the following method using the adhesive sheet 10 as prepared above.

<Frame Adhering Step>

First, the adhesive sheet 10 is adhered to the ring frame 3.

<Wafer Adhering Step and Heating Step>

Next, the adhesive sheet 10 was adhered to the outer peripheral part 4*a* of the semiconductor 4 in the decompression chamber 16, the outer peripheral part 4*a* on the surface where the convex part 5 was provided. Used was the semiconductor wafer 4 having a diameter of 8 inches and a thickness of 725 μm, in which a bump (protruding electrode) with a height of 230 μm was formed in the region excluding the outer peripheral part with a width of 3.0 mm. The width of the adhering surface where the semiconductor wafer 4 was adhered to the adhesive layer 2 was 2.0 mm. The pressure in the decompression chamber 16 was 100 Pa. The base material layer 1 was heated to 100° ° C. in the decompression chamber 16.

Next, the adhesive sheet 10 with the semiconductor wafer 4 adhered was removed from the decompression chamber 16.

<Cutting Step>

Next, the ring frame 3 was separated from the adhesive sheet 10 by cutting the adhesive sheet 10 along the outer periphery of the semiconductor wafer 4.

<Resin Curing Step>

Next, the curable resin 8 was pressed and spread by moving the adhesive sheet 10 in the in-plane direction of the support film 7 with the adhesive sheet 10 facing the curable resin 8 supplied on the support film 7. Used was the curable resin 8 configured of 1,2-hydrogenated polybutadiene-terminated urethane (meth) acrylate, isobornyl acrylate, and diethylacrylamide. The viscosity of the curable resin 8 before curing (measured using an E-type viscometer under the conditions of 23° C. and 50 rpm) was 470 mPa·s.

Next, the curable resin 8 was cured with the base material layer 1 in contact with the curable resin 8, and was made into the cured resin 18. The curable resin 8 was cured by irradiating the curable resin from the side of the support film 7 with ultraviolet rays so that the integrated light quantity at a wavelength of 365 nm became 2000 mJ/cm$^2$. The Shore D hardness (JIS K 6253) of the cured resin 18 was 15.

<Grinding Step>

Next, back grinding of the semiconductor wafer 4 was performed until the thickness of the semiconductor wafer 4 became 200 μm. The back grinding was performed using a polishing machine (back grinder DFG-841, made by DISCO Corporation).

<Peeling Step>

Next, the adhesive sheet 10 was peeled from the semiconductor wafer 4.

3. Evaluation

Each evaluation was conducted for the manufactured adhesive sheet 10. The results are shown in Table 1.

As shown in Table 1, good results were obtained for all evaluation items in all Examples. In Comparative Example 1 where corona discharge treatment was not applied to the cushion layer 1*a* and the surface treatment layer 1*b* was not formed, the adhesion between the base material layer 1 and the adhesive layer 2 was insufficient. In Comparative Example 2 where corona discharge treatment was applied to the cushion layer 1*a* and the surface treatment layer 1*b* was not formed, the peelability between the base material layer 1 and the wafer 4 was insufficient. In Comparative Example 3 where the surface treatment layer 1*b* was not cross-linked, adhesive residue was left on the wafer, in addition to insufficient adhesion between the cushion layer 1*a* and the surface treatment layer 1*b*. In Comparative Example 4 where the adhesive layer 2 was formed using the natural rubber-based adhesive, the adhesion between the base material layer 1 and the adhesive layer 2 was insufficient.

TABLE 1

| | | Example | | | | Comparative Example | | | |
|---|---|---|---|---|---|---|---|---|---|
| | | 1 | 2 | 3 | 4 | 1 | 2 | 3 | 4 |
| With or Without Corona Discharge Treatment to Cushion Layer | | w/o | w/ | w/o | w/ | w/o | w/ | w/ | w/ |
| With or Without Surface Treatment Layer | | w/ (Acrylic) | w/ (Acrylic) | w/ (Acrylic) | w/ (Acrylic) | w/o | w/o | w/ (Acrylic) | w/ (Acrylic) |
| Cross-linking Method of Surface Treatment Layer | | Light Irradiation | Light Irradiation | Heating | Heating | — | — | — | Light Irradiation |
| Kind of Resin of Adhesive Layer | | Acrylic | Acrylic | Acrylic | Acrylic | Acrylic | Acrylic | Acrylic | Natural Rubber-based |
| Evaluation | Bump Followability | Excellent | Excellent | Excellent | Excellent | Excellent | Excellent | Excellent | Excellent |
| | Adhesion between Cushion Layer and Surface Treatment Layer | Excellent | Excellent | Excellent | Excellent | — | — | Bad | Excellent |
| | Adhesion between Base Material Layer and Adhesive Layer | Excellent | Excellent | Excellent | Excellent | Bad | Excellent | Excellent | Bad |
| | Adhesive Force between Base Material Layer and Wafer (N/200 mm) | 0.5 | 0.5 | 2 | 2 | 21 | 62 | 38 | 42 |
| | Peelability between Base Material Layer and Wafer | Excellent | Excellent | Excellent | Excellent | Excellent | Bad | Excellent | Excellent |
| | With or Without Adhesive Residue on Wafer | w/o | w/o | w/o | w/o | w/o | w/o | w/ | w/o |
| | Storage Modulus E' of Surface Treatment Layer at 180° C. (Pa) | $1.1 \times 10^4$ | $1.1 \times 10^4$ | $1.0 \times 10^6$ | $1.0 \times 10^6$ | — | — | Unmeasurable due to Melting | $1.0 \times 10^5$ |

Details of the evaluation method are as follows.

<Bump Followability>

The bump followability was evaluated by the following method.

The distance that the base material layer 1 followed between bumps was measured for the adhesive sheet 10 to which the semiconductor wafer 4 was adhered after the cutting step of "2. Back Grinding of Semiconductor Wafer" described above, and the followability rate (=distance that the base material layer 1 followed between bumps/bump height) was calculated.

The bump followability was evaluated from the followability rate using the following criteria.

Excellent: Followability rate is 70% or more

Bad: Followability rate is less than 70%

<Adhesion between Cushion Layer and Surface Treatment Layer>

After cross-cutting the surface treatment layer 1*b* on the cushion layer 1*a* (100 squares of 1 $mm^2$), a cellophane adhesive tape (made by Nichiban Co., Ltd) compliant to JIS Z 1522 was adhered onto the surface treatment layer 1*b*, strongly pressed with a finger, and peeled in a 90° direction. The evaluation was conducted based on whether or not the surface treatment layer 1*b* was peeled.

Excellent: No peeling observed

Bad: Peeling observed

<Adhesin between Base Material Layer and Adhesive Layer>

After the peeling step of "2. Back Grinding of Semiconductor Wafer" described above, peeling of the adhesive layer 2 of the adhesive sheet 10 was observed by visual check.

Excellent: No peeling observed

Bad: Half or more, or the whole was peeled

<Peelability and Adhesive Force between Base Material and Wafer>

The adhesive force between the base material layer and the wafer was measured by the following method. A test piece having a width of 10 mm and a length of 100 mm was cut from the area near the center of the adhesive sheet 10 where the adhesive layer 2 is not formed (i.e., the area where the base material layer is exposed), and this test piece was used to measure the adhesive force in accordance with the adhesive force measurement method of JIS Z0237 (2009) (Method 1: Test method in which tape and sheet are peeled at 180° to a stainless steel test plate. Specifically, using a crimping device (roller weight: 2 kg), the test piece was crimped to the adherend (Si wafer) whose surface had been cleaned, and then heated on a hot plate at 100° C. for 1 minute. The adhesive force when the test piece was pulled and peeled at 180° to the adherend was measured with a universal tensile tester (ORIENTEC Tensilon Model No.: RTG-1210) at a temperature of 23° C. and at a humidity of 50% using the following conditions, and converted to a value at a width of 200 mm.

Measuring mode: Tensile

Pulling speed: 300 mm/min

Distance between chucks: 50 mm

Measurement sample width: 10 mm

The peelability between the base material layer and the wafer was evaluated from the obtained measurement results of the adhesive force using the following criteria.

Excellent: 0.5 to 50 N/200 mm

Bad: Higher than 50 N/200 mm

<Adhesive Residue on Wafer>

In the above-described test, the presence or absence of adhesive residue on the silicon wafer after peeling was confirmed by visual check and evaluated using the following criteria.

Excellent: Without adhesive residue

Bad: With adhesive residue

<Storage Modulus E' of Surface Treatment Layer at 180° C.>

The surface treatment agent used in each of Examples and Comparative

Examples was applied to the release-treated surface of a release-treated polyethylene terephthalate film, and dried at 100° ° C. for 1 minute to obtain the 25 μm-thick surface treatment layer. Then, a curing reaction was performed. Thereafter, the surface treatment layer was die-cut into a sample having a width of 3 mm and a length of 7 mm. The storage modulus E' was measured in tensile mode using a viscoelasticity measuring device (RSA-3, made by TA Instruments) under the following conditions to obtain the storage modulus E' when the temperature reached at 180° C.

Frequency: f=1 Hz

Temperature: 30 to 180° C.

Temperature rising rate: 5° C./min

Distance between chucks: 10 mm

REFERENCE SIGNS LIST

1: base material layer, 1*a*: cushion layer, 1*b*: surface treatment layer, 1*c*: barrier layer, 2: adhesive layer, 2*a*: opening part, 2*b*: sealed space, 3: ring frame, 3*a*: opening part, 4: semiconductor wafer, 4*a*: outer peripheral part, 4*b*: backside 5: convex part, 6: decompression unit, 6*a*: decompression hole, 7: support film 8: curable resin, 9: energy ray, 10: adhesive sheet, 11: base material sheet, 16: decompression chamber, 18: cured resin

The invention claimed is:

1. An adhesive sheet for back grinding of a semiconductor wafer having a convex part, comprising: a base material layer; and an adhesive layer provided on the base material layer, wherein:

the adhesive layer comprises an opening part having a diameter smaller than a diameter of the semiconductor wafer;

the adhesive layer is adhered to an outer peripheral part of the semiconductor wafer so that the convex part of the semiconductor wafer is placed in the opening part;

the adhesive layer is configured so that the convex part is protected by the base material layer with the semiconductor wafer adhered to the adhesive layer;

the base material layer comprises a cushion layer and a surface treatment layer provided thereon;

the adhesive layer is provided on the surface treatment layer;

the surface treatment layer is formed of an acrylic resin composition containing an acrylic resin;

the acrylic resin is cross-linked by light irradiation or heating;

the adhesive layer is formed of an acrylic resin composition containing an acrylic resin; and a storage modulus of the surface treatment layer at 180° C. is $1.0\times10^4$ Pa to $1.0\times10^8$ Pa.

2. The adhesive sheet of claim 1, wherein the convex part is protected by being embedded in the base material layer.

3. The adhesive sheet of claim 1, wherein the semiconductor wafer is adhered to the adhesive layer under reduced pressure.

4. The adhesive sheet of claim 1, wherein an adhesive force measured in accordance with JIS Z0237 at 23° C. between the base material layer and the semiconductor wafer after heating the semiconductor wafer to which the base material layer of a test piece cut from the adhesive sheet is adhered for 1 minute at 100° C. and cooling to room temperature is lower than 6 N/200 mm.

5. A method for manufacturing a semiconductor wafer using an adhesive sheet, the method comprising: a frame adhering step; a wafer adhering step; a heating step; a cutting step; a resin curing step; and a grinding step, the adhesive sheet is an adhesive sheet for back grinding of a semiconductor wafer having a convex part, comprising: a base material layer; and an adhesive layer provided on the base material layer, wherein:

the adhesive layer comprises an opening part having a diameter smaller than a diameter of the semiconductor wafer;

the adhesive layer is adhered to an outer peripheral part of the semiconductor wafer so that the convex part of the semiconductor wafer is placed in the opening part;

the adhesive layer is configured so that the convex part is protected by the base material layer with the semiconductor wafer adhered to the adhesive layer;

the base material layer comprises a cushion layer and a surface treatment layer provided thereon;

the adhesive layer is provided on the surface treatment layer;

the surface treatment layer is formed of an acrylic resin composition containing an acrylic resin;

the acrylic resin is cross-linked by light irradiation or heating; and the adhesive layer is formed of an acrylic resin composition containing an acrylic resin, and wherein:

in the frame adhering step, the adhesive sheet is adhered to a ring frame;

in the wafer adhering step, the adhesive sheet is adhered to the outer peripheral part of the semiconductor wafer under reduced pressure, the outer peripheral part on a surface of the semiconductor wafer where the convex part is provided;

in the heating step, the base material layer is heated;

in the cutting step, the adhesive sheet is cut along an outer periphery of the semiconductor wafer;

in the resin curing step, the base material layer is brought in contact with a curable resin after the wafer adhering step, and the curable resin is cured in that state; and in the grinding step, a backside of the semiconductor wafer is ground.

6. A base material sheet, comprising: a cushion layer; and a surface treatment layer provided thereon, wherein:

the surface treatment layer is formed of an acrylic resin composition containing an acrylic resin;

the acrylic resin is cross-linked by light irradiation or heating; and a storage modulus of the surface treatment layer at 180° C. is $1.0\times10^4$ Pa to $1.0\times10^8$ Pa.

* * * * *